United States Patent
Kim et al.

(10) Patent No.: US 8,791,455 B2
(45) Date of Patent: Jul. 29, 2014

(54) FLEXIBLE DISPLAY APPARATUS

(71) Applicant: Samsung Display Co., Ltd., Yongin (KR)

(72) Inventors: Kwang-Min Kim, Yongin (KR); Won-Kyu Kwak, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/794,777

(22) Filed: Mar. 11, 2013

(65) Prior Publication Data

US 2014/0097408 A1   Apr. 10, 2014

(30) Foreign Application Priority Data

Oct. 8, 2012   (KR) ........................ 10-2012-0111423

(51) Int. Cl.
- *H01L 51/44* (2006.01)
- *H01L 51/00* (2006.01)
- *H01L 27/32* (2006.01)

(52) U.S. Cl.
CPC ........ *H01L 51/0097* (2013.01); *H01L 27/3237* (2013.01); *H01L 51/441* (2013.01)
USPC ........................................................ 257/40

(58) Field of Classification Search
CPC ................................................ H01L 27/3237
See application file for complete search history.

(56) References Cited

U.S. PATENT DOCUMENTS

| | | | |
|---|---|---|---|
| 6,657,606 B2* | 12/2003 | Kang et al. ..................... 345/87 |
| 6,806,936 B2* | 10/2004 | Nakaminami et al. ........ 349/149 |
| 7,348,492 B1* | 3/2008 | Kawai et al. .................. 174/254 |
| 7,928,654 B2* | 4/2011 | Tsuchiya et al. .............. 313/512 |
| 2010/0270923 A1 | 10/2010 | Froehlich et al. |
| 2011/0026233 A1 | 2/2011 | Hong et al. |
| 2012/0301688 A1* | 11/2012 | Mikalo et al. ................. 428/209 |
| 2013/0148312 A1* | 6/2013 | Han et al. ...................... 361/736 |
| 2014/0002385 A1* | 1/2014 | Ka et al. ........................ 345/173 |
| 2014/0055702 A1* | 2/2014 | Park et al. ....................... 349/43 |

FOREIGN PATENT DOCUMENTS

| | | |
|---|---|---|
| JP | 2010-258451 A | 11/2010 |
| KR | 10-2008-0000017 A | 1/2008 |
| KR | 10-2011-0012280 | 2/2011 |
| KR | 10-2011-0072907 A | 6/2011 |
| KR | 10-2012-0092313 A | 8/2012 |

* cited by examiner

*Primary Examiner* — Stephen W Smoot
(74) *Attorney, Agent, or Firm* — Christie, Parker & Hale, LLP (57) ABSTRACT

A flexible display apparatus includes a flexible substrate having a bending area, and a non-bending area adjacent the bending area, and having a display area for realizing a visible image, a plurality of wirings at the bending area, and a plurality of insulating patterns between the flexible substrate and the plurality of wirings, wherein respective ones of the plurality of insulating patterns are separated by separate areas.

23 Claims, 8 Drawing Sheets

FLEXIBLE DISPLAY APPARATUS

CROSS-REFERENCE TO RELATED PATENT APPLICATION

This application claims priority to and the benefit of Korean Patent Application No. 10-2012-0111423, filed on Oct. 8, 2012, in the Korean Intellectual Property Office, the disclosure of which is incorporated herein in its entirety by reference.

BACKGROUND

1. Field

Embodiments of the present invention relate to a flexible display apparatus.

2. Description of the Related Art

At present, conventional display apparatuses are being replaced with thin flat and portable panel display apparatuses. Also, the applications and uses of flexible display apparatuses that are bendable or foldable as desired, or flexible display apparatuses that are bendable or foldable during manufacture, are receiving attention.

However, when bending or folding a display apparatus, because bent or folded portions of the display apparatus are vulnerable with respect to stress, the display apparatus may become deformed or damaged, or the properties, or integrity, of the display apparatus may deteriorate.

As a result, when a user bends or folds a flexible display apparatus (e.g., repeated bends or folds), the durability of the flexible display apparatus may be reduced.

SUMMARY

Embodiments of the present invention provide a flexible display apparatus capable of improving durability and user convenience.

According to an aspect of embodiments of the present invention, there is provided a flexible display apparatus including a flexible substrate having a bending area, and a non-bending area adjacent the bending area, and having a display area for realizing a visible image, a plurality of wirings at the bending area, and a plurality of insulating patterns between the flexible substrate and the plurality of wirings, wherein respective ones of the plurality of insulating patterns are separated by separate areas.

The bending area may be configured to be bent or folded with respect to a reference line.

The reference line may be at the bending area.

The separate areas may be parallel to the reference line.

The separate areas might not be perpendicular to the reference line.

The plurality of insulating patterns may be parallel to the reference line.

The plurality of insulating patterns might not be perpendicular to the reference line.

The separate areas may extend in stripes.

The separate areas may extend to two ends of the flexible substrate that face each other.

The plurality of insulating patterns may extend in stripes.

The plurality of wirings may be conformally arranged on the substrate and the plurality of insulating patterns.

The flexible display apparatus may further include a protective layer on the plurality of wirings.

The protective layer may be conformally arranged on the plurality of wirings.

The plurality of wirings may have one or more via holes.

The one or more via holes of the plurality of wirings may be a plurality of dot-type via holes or stripe-type via holes.

The non-being area may have a first non-bending area and a second non-bending area, and the bending area may be between the first non-bending area and the second non-bending area.

The first non-bending area and the second non-bending area may respectively include display areas.

One of the first non-bending area and the second non-bending area may include the display area for displaying an image, and the other one of the first non-bending area and the second non-bending area may include a region corresponding to a circuit pattern for driving the display area.

The display area of the non-bending area may include an organic light-emitting device, and the organic light-emitting device may include a first electrode, a second electrode, and an intermediate layer between the first electrode and the second electrode, and may include an organic-light emitting layer.

The flexible display apparatus may further include a thin film transistor that is electrically coupled to the organic light-emitting device and that includes an active layer, a gate electrode, a source electrode, and a drain electrode.

The plurality of wirings may include a same material as any one of the gate electrode, the source electrode, and the drain electrode, and are concurrently formed with any one of the gate electrode, the source electrode, and the drain electrode.

The flexible display apparatus may further include a gate insulating layer between the active layer and the gate electrode, and an interlayer insulating layer between the gate electrode and the source electrode, and between the gate electrode and the drain electrode, and the plurality of insulating patterns may include a same material as any one of the gate insulating layer and the interlayer insulating layer, and may be concurrently formed with any one of the gate insulating layer and the interlayer insulating layer.

The flexible display apparatus may further include a buffer layer between the substrate and the thin film transistor, and the plurality of insulating patterns may include a same material as the buffer layer, and may be concurrently formed with the buffer layer.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

Embodiments of the present invention may be implemented in various different forms, and the present invention is not limited to the described embodiments. Sizes and thicknesses of the elements shown in the drawings are for the purpose of descriptive convenience, and thus the present invention is not necessarily limited thereto.

Thicknesses of layers and regions may be expanded in the drawings for clarity. For descriptive convenience, thicknesses of some layers and regions may be exaggerated in the drawings. When an element such as, for example, a layer, a film, a region, or a board is referred to as being "on" another element, they can be directly on the element, or one or more intervening elements may also be present.

Throughout this specification, unless explicitly described to the contrary, the word "comprise," and variations thereof such as "comprises" or "comprising", will be understood to imply the inclusion of stated elements, but not to the exclusion of any other elements. Further, throughout this specification, the term "above" encompasses both an orientation of above and below, and does not necessarily encompass the orientation of above or below with respect to the direction of gravity.

Exemplary embodiments of the present invention are described in detail so those of ordinary skill in the art may implement embodiments of the present invention with reference to the accompanying drawings.

Figure 1:
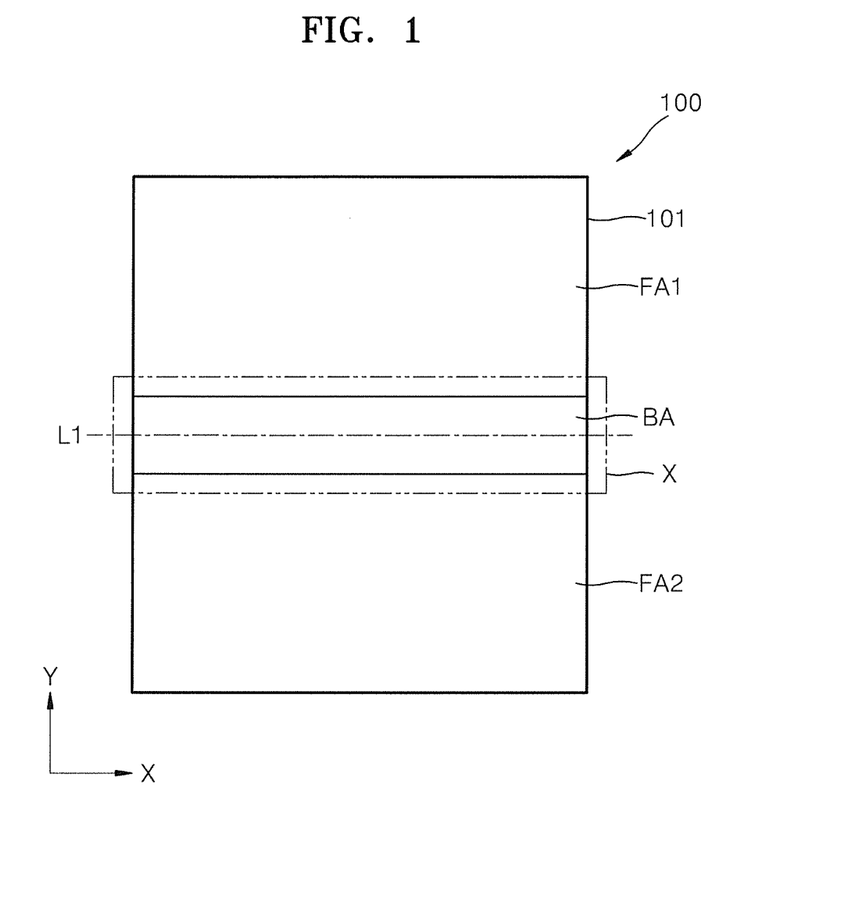
FIG. 1 is a schematic plan view of a flexible display apparatus according to an embodiment of the present invention.
Figure 2:
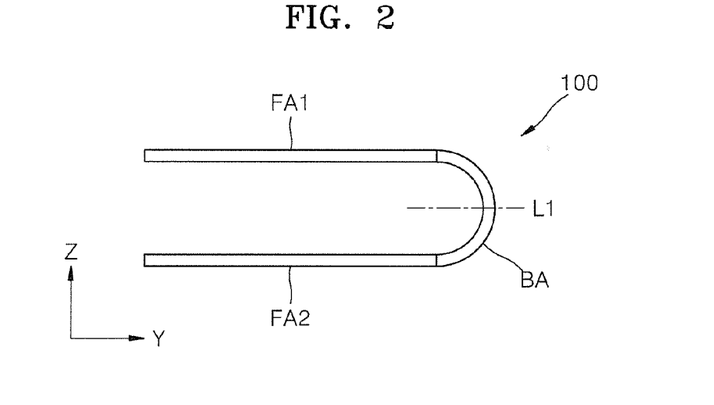
FIG. 2 is a schematic side view of a case where the flexible display apparatus of FIG. 1 is folded/bent, according to an embodiment of the present invention.
Figure 3:
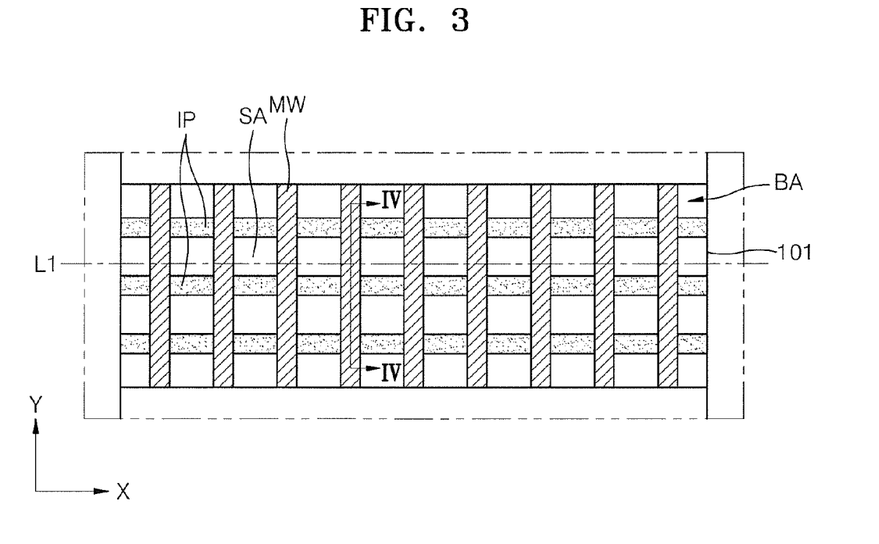
FIG. 3 is an enlarged diagram of the portion X of FIG. 1, according to an embodiment of the present invention.
Figure 4A:
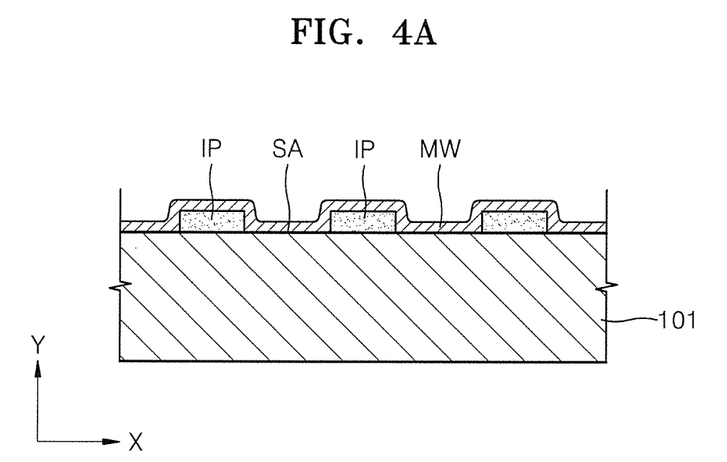
FIG. 4A is a cross-sectional view of the flexible display apparatus taken along the line IV-IV of FIG. 3, according to an embodiment of the present invention.

FIG. 1 is a schematic plan view of a flexible display apparatus 100 according to an embodiment of the present invention. FIG. 2 is a schematic side view of a case where the flexible display apparatus 100 of FIG. 1 is folded/bent. FIG. 3 is an enlarged diagram of the portion X of FIG. 1. FIG. 4A is a cross-sectional view of the flexible display apparatus 100 taken along the line IV-IV of FIG. 3.

Referring to FIGS. 1 to 4A, the flexible display apparatus 100 includes a substrate 101 on which a bending area BA and non-bending areas FA1 and FA2 are defined.

The bending area BA contains a reference line L1 (e.g., an imaginary line shown in FIGS. 1 and 2). The flexible display apparatus 100 may be bent or folded (e.g., in two directions) with respect to the reference line L1. That is, as shown in FIG. 2, the bending area BA includes at least an uneven area. For example, the bending area BA may include uneven areas having shapes that may be substantially symmetrical with respect to each other.

The non-bending areas FA1 and FA2 include a first non-bending area FA1 and a second non-bending area FA2, which are located at respective sides of the bending area BA to face each other. That is, the bending area BA is located between the first non-bending area FA1 and the second non-bending area FA2. The first non-bending area FA1 and the second non-bending area FA2 may include at least a smooth area, and in detail, may be flat (e.g., thoroughly, or entirely, flat) without any uneven area.

The first non-bending area FA1 and the second non-bending area FA2 may have various forms to perform various functions. In detail, both of the first non-bending area FA1 and the second non-bending area FA2 may include respective display areas for displaying an image(s) to enable a user to view the image(s) in upper and lower directions with respect to FIG. 2.

As another example, the first non-bending area FA1 may include a display area for displaying an image, and the second non-bending area FA2 may include circuit patterns for applying a signal(s) for driving the display area of the first non-bending area FA1, enabling the user to view the image(s) projected toward the upper direction with respect to FIG. 2.

The substrate 101 may be formed of a flexible material so as to be bent or folded as desired. For example, the substrate 101 may be formed of a plastic material, which may be one or more selected from various organic materials. For example, a user may fold the flexible display apparatus 100 with respect to the reference line L1 of the substrate 101, as shown in FIG. 2.

The bending area BA includes a plurality of wirings MW, a plurality of insulating patterns IP, and separate areas SA. The wirings MW are coupled to the first non-bending area FA1 and the second non-bending area FA2. As described above, when both of the non-bending areas FA1 and FA2 include the respective display areas, the wirings MW may be coupled to the display areas. In addition, when the first non-bending area FA1 includes a display area for displaying an image, while the second non-bending area FA2 includes circuit patterns for applying a signal for driving the display area of the first non-bending area FA1, the wirings MW may be coupled to the display area of the first non-bending area FA1 and to the circuit patterns of the second non-bending area FA2.

The wirings MW of the present embodiment are formed in stripes having widths and extending in one direction. In detail, the wirings MW cross the reference line L1.

The insulating patterns IP are formed between the substrate 101 and the wirings MW, and the separate areas SA correspond to regions where the wirings MW contact the substrate 101.

In detail, referring to FIGS. 3 and 4, the insulating patterns IP are formed on the substrate 101, and the separate areas SA are between the insulating patterns IP. Because the separate areas SA are regions where the insulating patterns IP do not exist, the insulating patterns IP are spaced apart from each other by the separate areas SA.

The insulating patterns IP and the separate areas SA extend (e.g., extend a relatively long way). In detail, the insulating patterns IP and the separate areas SA are formed in parallel to the reference line L1. In the present embodiment, the separate areas SA are formed to extend to two side ends of the bending area BA in a direction of the reference line L1. That is, with respect to FIG. 3, the separate areas SA extend to right and left ends of the substrate 101.

Although not shown, the insulating patterns IP and the separate areas SA may be formed to be inclined at an angle with respect to the reference line L1. The insulating patterns IP and the separate areas SA may be inclined at a relatively small angle with respect to the reference line L1, and in detail, may also be formed in parallel to the reference line L1. In the present embodiment, a direction in which the insulating patterns IP and the separate areas SA extend may not be perpendicular to the reference line L1.

Due to the insulating patterns IP and the separate areas SA, the wirings MW of the present embodiment may not be flat, and may have an uneven shape, as shown in FIG. 4A. That is, portions of the wirings MW that correspond to the insulating patterns IP may protrude, and portions of the wirings MW that correspond to the separate areas SA may be concave.

According to the present embodiment, the flexible display apparatus 100 includes the substrate 101 formed of a flexible material so as to be bent or folded with respect to the reference line L1. In the present embodiment, the bending area BA that is folded with respect to the reference line L1 undergoes stress, and thus, is likely to be deformed. In particular, when stress is applied to an insulating layer that is formed below the wirings MW on the substrate 101, the insulating layer may be damaged, and for example, may crack. The damage may be transferred to the wirings MW formed above the insulating layer to affect the durability of the flexible display apparatus 100.

However, according to the present embodiment, the insulating patterns IP and the separate areas SA are located between the wirings MW of the bending area BA and the substrate 101. The insulating patterns IP and the separate areas SA are formed in parallel to the reference line L1, or may be inclined with respect to, or at an angle to, the reference line L1. Thus, even if the flexible display apparatus 100 is folded with respect to the reference line L1, the separate areas SA located between the insulating patterns IP of the bending area BA relieve stress, thereby reducing stress applied to the insulating patterns IP. Thus, the insulating patterns IP are less likely to be damaged, thereby reducing the likelihood that the wirings MW will be damaged. To increase an effect for avoiding or preventing damage to the insulating patterns IP, the insulating patterns IP and the separate areas SA may be formed in parallel to the reference line L1.

In addition, the separate areas SA are formed to the two side ends of the substrate 101, thereby increasing an effect for relieving stress via the separate areas SA.

Due to the insulating patterns IP and the separate areas SA, the wirings MW may be formed to have an uneven shape. Thus, when the flexible display apparatus 100 is folded with respect to the reference line L1, an effect for relieving stress of the wirings MW of the bending area BA is increased. That is, by virtue of an increase in a surface area of the wirings MW on the bending area BA, as well as protruding portions and concave portions that are alternately formed on the wirings MW, stress applied to the wirings MW may be effectively relieved.

Thus, the durability of the flexible display apparatus 100 is increased.

Figure 4B:
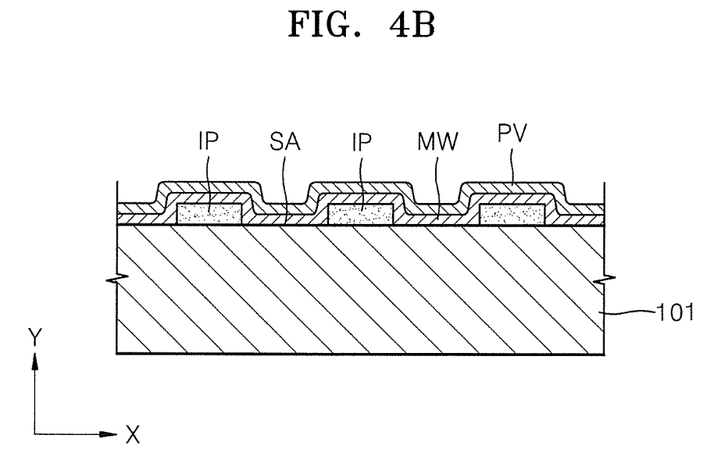
FIG. 4B is a schematic cross-sectional view of a modified example of the flexible display apparatus of FIG. 1, according to an embodiment of the present invention.

FIG. 4A illustrates an embodiment where no member exists on the wirings MW. However, the present invention is not limited thereto. That is, as shown in FIG. 4B illustrating a modified example of the embodiment shown in FIG. 1, a protective layer PV may be formed on the wirings MW. In the embodiment of FIG. 4B, because the protective layer PV has uneven portions, stress may be relieved due to the protective layer PV itself. Thus, although the protective layer PV is added, the protective layer PV may be easily prevented from being deformed or damaged due to stress.

Figure 5:
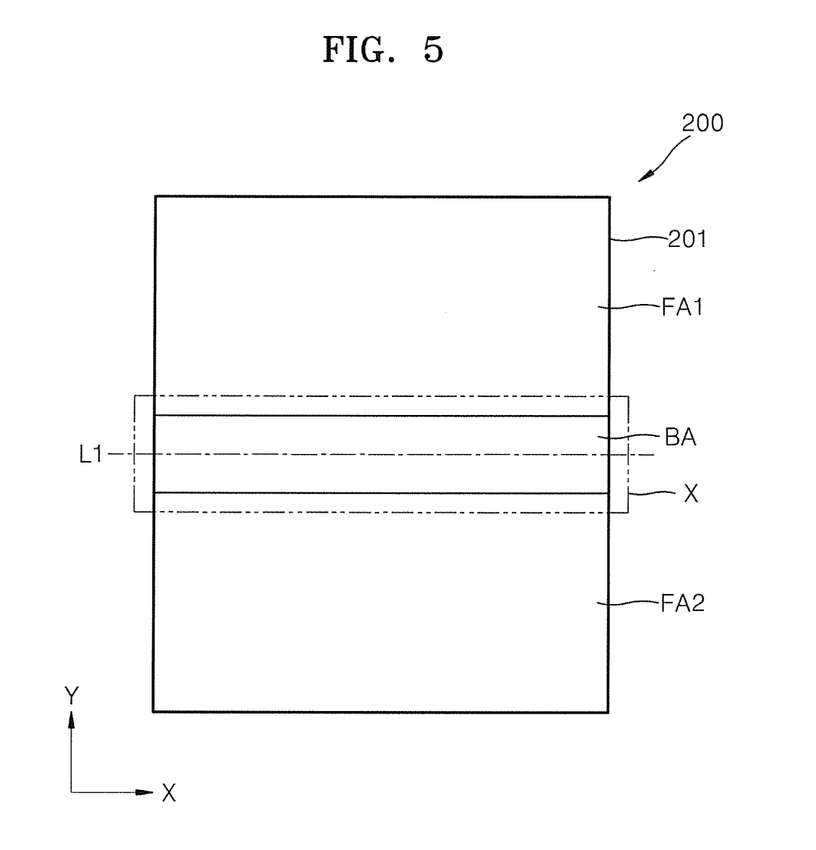
FIG. 5 is a schematic plan view of a flexible display apparatus according to another embodiment of the present invention.
Figure 6:
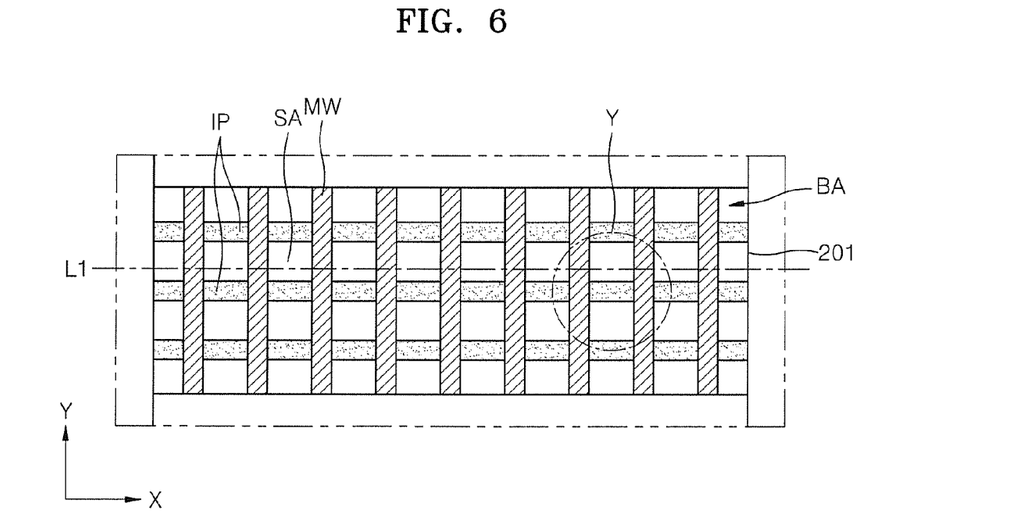
FIG. 6 is an enlarged diagram of the portion X of the embodiment shown in FIG. 5.
Figure 7:
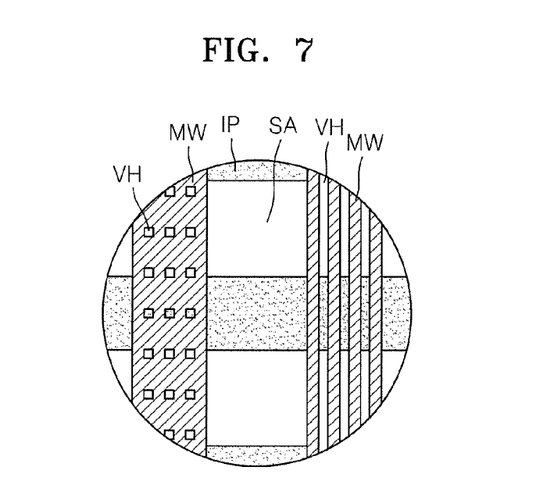
FIG. 7 is an enlarged diagram of the portion Y of the embodiment shown in FIG. 6.

FIG. 5 is a schematic plan view of a flexible display apparatus 200 according to another embodiment of the present invention. FIG. 6 is an enlarged diagram of the portion X of FIG. 5. FIG. 7 is an enlarged diagram of the portion Y of FIG. 6.

Referring to FIGS. 5 to 7, the flexible display apparatus 200 includes a substrate 201 on which the bending area BA and the non-bending areas FA1 and FA2 are defined.

The bending area BA contains the reference line L1 shown in FIG. 5. The flexible display apparatus 200 may be bent or folded in two directions with respect to the reference line L1.

Thus, the bending area BA includes at least an uneven area. For example, the bending area BA may include uneven areas having shapes symmetrical with respect to each other.

The non-bending areas FA1 and FA2 include the first non-bending area FA1 and the second non-bending area FA2, which are located at respective sides of the bending area BA to face each other. That is, the bending area BA is located between the non-bending areas FA1 and FA2. The first non-bending area FA1 and the second non-bending area FA2 may include a smooth area, and in detail, may entirely be flat without any uneven area.

The first non-bending area FA1 and the second non-bending area FA2 may be manufactured to have various forms to perform various functions. In detail, both of the first non-bending area FA1 and the second non-bending area FA2 may include respective display areas for displaying images. As another example, the first non-bending area FA1 may include a display area for displaying an image(s), and the second non-bending area FA2 may include circuit patterns for applying a signal(s) for driving the display area of the first non-bending area FA1.

The substrate 201 is formed of a flexible material so as to be bent or folded as desired. For example, a user may fold/bend the substrate 201 with respect to the reference line L1 of the substrate 201.

The bending area BA includes the wirings MW, the insulating patterns IP, and the separate areas SA. The wirings MW are coupled to the first non-bending area FA1 and the second non-bending area FA2, and may be formed in stripes having widths and extending in one direction. In detail, the wirings MW extend to cross the reference line L1.

Referring to FIG. 7, the wirings MW include one or more via holes VH, which may have various shapes. That is, as shown in FIG. 7, the wirings MW may include a plurality of dot-type via holes VH and/or stripe-type via holes VH.

The insulating patterns IP and the separate areas SA are formed between the substrate 201 and the wirings MW.

In detail, the separate areas SA are formed between the insulating patterns IP. Because the separate areas SA are regions where the insulating patterns IP do not exist, the insulating patterns IP are separated by the separate areas SA.

The insulating patterns IP and the separate areas SA of the present embodiment extend a relatively long way, and are formed in parallel to the reference line L1. In the present embodiment, the separate areas SA are formed to extend to two side ends of the bending area BA in a direction of the reference line L1.

The insulating patterns IP and the separate areas SA may be formed to be inclined at an angle with respect to the reference line L1. The insulating patterns IP and the separate areas SA may be inclined at a relatively small angle with respect to the reference line L1, and may even be in parallel to the reference line L1. In the present embodiment, a direction in which the insulating patterns IP and the separate areas SA extend may not be perpendicular to the reference line L1.

Due to the insulating patterns IP and the separate areas SA, the wirings MW of the present embodiment are not flat, and may have an uneven shape, like in the above-described embodiment. That is, portions of the wirings MW, which correspond to the insulating patterns IP, may protrude, and portions of the wirings MW, which correspond to the separate areas SA, may be concave.

According to the present embodiment, the flexible display apparatus 200 includes the insulating patterns IP and the separate areas SA, which are formed between the substrate 201 and the wirings MW of the bending area BA. The insulating patterns IP and the separate areas SA may be parallel to the reference line L1, or may be inclined with respect to the reference line L1. Thus, even if the flexible display apparatus 200 is folded with respect to the reference line L1, the separate areas SA located between the insulating patterns IP of the bending area BA relieve stress applied to the insulating patterns IP. Thus, the insulating patterns IP are less likely to be damaged, thereby reducing the likelihood that the wirings MW will be damaged. To avoid damaging the insulating patterns IP, the insulating patterns IP and the separate areas SA may be formed in parallel to the reference line L1.

In addition, the separate areas SA are formed to the two side ends of the substrate 201, thereby increasing an effect for relieving stress via the separate areas SA.

Due to the insulating patterns IP and the separate areas SA, the wirings MW may be formed to have an uneven shape. Thus, when the flexible display apparatus 200 is folded or bent with respect to the reference line L1, an effect for relieving stress of the wirings MW of the bending area BA is increased. That is, by virtue of an increase in a surface area of the wirings MW having alternating protruding portions and concave portions on the bending area BA, stress applied to the wirings MW may be effectively relieved.

In addition, because the dot-type via holes VH or the stripe-type via holes VH are formed in the wirings MW, when the flexible display apparatus 200 is bent or folded, if stress is applied to the wirings MW, the via hole VH may, additionally, effectively relieve the stress. As a result, stress that is actually applied to the wirings MW may be effectively relieved. Thus, the durability of the flexible display apparatus 200 is increased.

Although not shown in FIGS. 5 to 7, a protective layer PV may be selectively formed on the wirings MW, like in FIG. 4B.

The flexible display apparatus 100 may be manufactured by using various methods. Hereinafter, a method of manufacturing the flexible display apparatus 100 will be described in detail with regard to an embodiment of the present invention.

The present embodiment of the method of manufacturing the flexible display apparatus 100 includes forming the insulating patterns IP and the wirings MW on the substrate 101.

The forming of the insulating patterns IP on the substrate 101 includes forming an insulating material on the substrate 101, and then forming the separate areas SA by using various patterning methods such as a photolithography method. Thus, the insulating patterns IP may be formed as a plurality of stripes that extend in one direction, as shown in FIG. 3. In the present embodiment, although not shown, the insulating patterns IP may be formed on at least one area of the first non-bending area FA1 and the second non-bending area FA2.

Then, the wirings MW are formed on the insulating patterns IP. The forming of the wirings MW may include forming a conductive material on the insulating patterns IP and the separate areas SA, followed by performing one or more of various patterning methods, such as a lithography method. Thus, the wirings MW may extend in a direction to cross the insulating patterns IP. In addition, the wirings MW are conformally formed by the insulating patterns IP and the separate areas SA. That is, the wirings MW protrude corresponding to the insulating patterns IP, and are concaved corresponding to the separate areas SA.

In addition, as shown in FIG. 4B, the protective layer PV may be further formed on the wirings MW.

Figure 8:
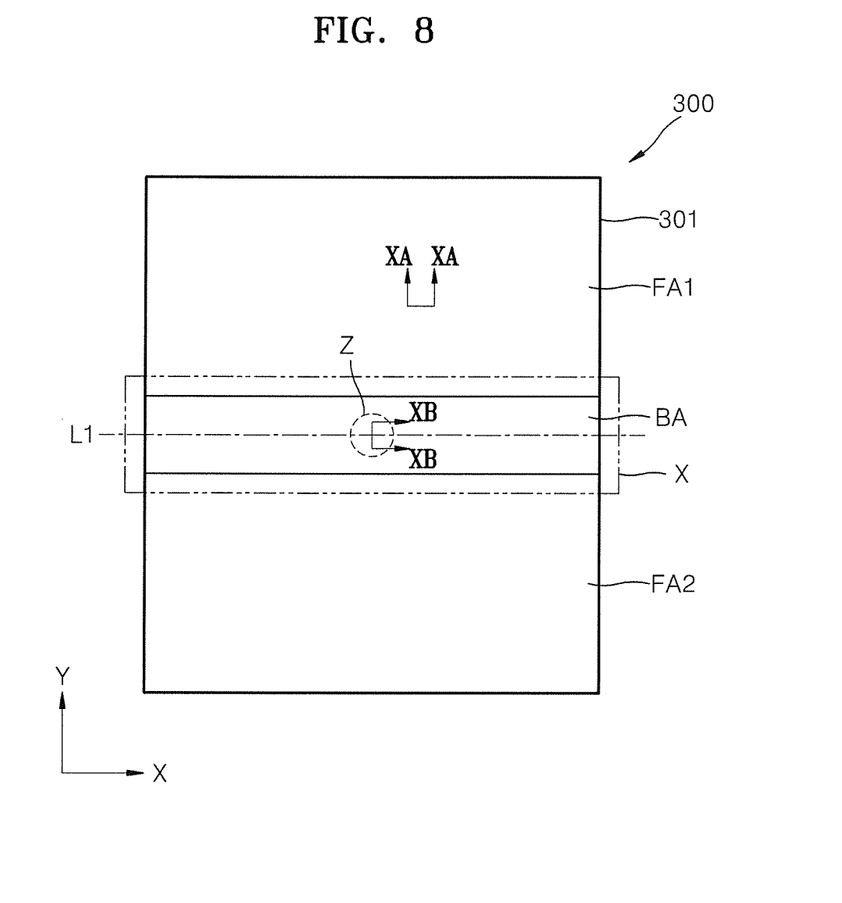
FIG. 8 is a schematic plan view of a flexible display apparatus according to another embodiment of the present invention.
Figure 9:
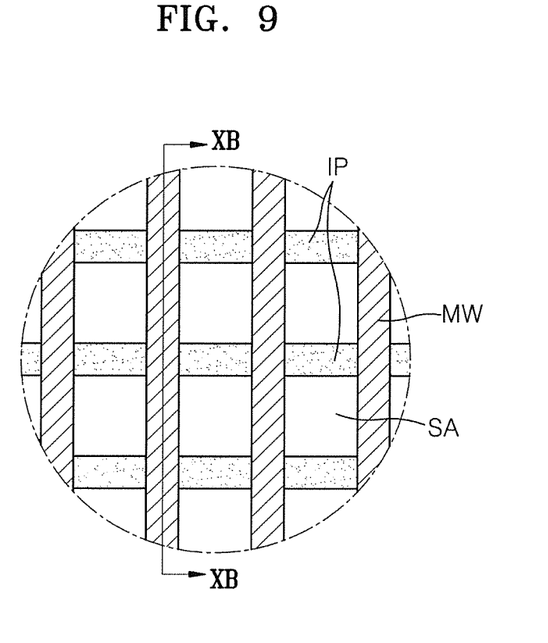
FIG. 9 is an enlarged diagram of the portion Z of the embodiment shown in FIG. 8.
Figure 10:
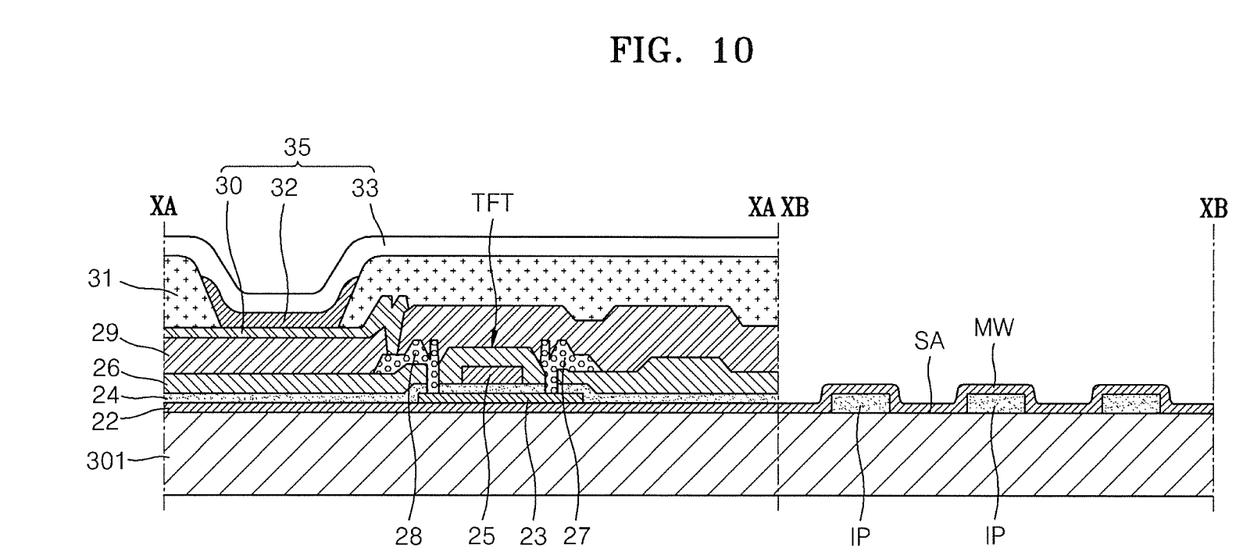
FIG. 10 is cross-sectional views of the flexible display apparatus of the embodiment shown in FIG. 8, taken along the lines XA-XA and XB-XB of FIG. 8.

FIG. 8 is a schematic plan view of a flexible display apparatus 300 according to another embodiment of the present invention. FIG. 9 is an enlarged diagram of the portion Z of FIG. 8. FIG. 10 is cross-sectional views of the flexible display apparatus 300 taken along the lines XA-XA and XB-XB of FIG. 8.

Referring to FIGS. 8 to 10, the flexible display apparatus 300 includes a substrate 301 on which the bending area BA and the non-bending areas FA1 and FA2 are defined.

The bending area BA contains a reference line L1 shown in FIG. 8. The flexible display apparatus 300 may be bent or folded in two directions with respect to the reference line L1. Thus, the bending area BA includes at least an uneven area, and may include uneven areas having shapes symmetrical with respect to each other.

The non-bending areas FA1 and FA2 include the first non-bending area FA1 and the second non-bending area FA2, which are located at respective sides of the bending area BA to face each other. That is, the bending area BA is located between the first non-bending area FA1 and the second non-bending area FA2. The first non-bending area FA1 and the second non-bending area FA2 may include at least a smooth area, and may be flat thoroughly (e.g., entirely flat) without any uneven area.

The first non-bending area FA1 and the second non-bending area FA2 may be manufactured to have various forms to perform various functions. In detail, both of the first non-bending area FA1 and the second non-bending area FA2 may include respective display areas for displaying an image(s). As another example, the first non-bending area FA1 includes a display area for displaying an image(s), and the second non-bending area FA2 may include circuit patterns for applying a signal(s) for driving the display area of the first non-bending area FA1. The display area of the first non-bending area FA1 will be described in detail.

The substrate 301 may be formed of a flexible material so as to be bent or folded as desired. For example, a user may fold the flexible display apparatus 300 with respect to the reference line L1 of the substrate 301.

The wirings MW, the insulating patterns IP, and the separate areas SA are formed on the bending area BA, as shown in FIG. 9. The wirings MW are coupled to the first and second non-bending areas FA1 and FA2, and are formed in stripes extending in one direction. In detail, the wirings MW cross the reference line L1. The wirings MW may also include one or more via holes VH, like the embodiment shown in FIG. 7.

The insulating patterns IP and the separate areas SA are formed between the substrate 301 and the wirings MW. In detail, the separate areas SA are formed between the insulating patterns IP. Because the separate areas SA are regions where the insulating patterns IP do not exist, the insulating patterns IP are separated by the separate areas SA. The insulating patterns IP, the separate areas SA, and the wirings MW have the same shapes as those shown in FIGS. 1 to 4A, and thus, detailed description thereof will be omitted herein.

Embodiments of the present invention are described below in more detail with reference to FIG. 10. As described above, the first non-bending area FA1 includes a display area for realizing an image. The display area includes an organic light-emitting device 35 for emitting visible rays, and a thin film transistor TFT that is electrically coupled to the organic light-emitting device 35.

The organic light-emitting device 35 includes a first electrode 30, an intermediate layer 32, and a second electrode 33. The thin film transistor TFT includes an active layer 23, a gate electrode 25, a source electrode 27, and a drain electrode 28, which will be described below in detail.

A buffer layer 22 is formed on the substrate 301. As with the above-described embodiments, the substrate 301 may be formed of a flexible material. The buffer layer 22 prevents or reduces impurities penetrating into the flexible display apparatus 300 through the substrate 301, and provides a flat surface on the substrate 301. Thus, the buffer layer 22 may include various materials to perform this function. The buffer layer 22 is not a necessary element, and thus, may be omitted from other embodiments of the present invention.

The active layer 23 having a pattern is formed on the buffer layer 22, and may be formed of an inorganic semiconductor such as, for example, silicon, an oxide semiconductor, or an organic semiconductor, and may include a source region, a drain region, and a channel region.

A gate insulating layer 24 is formed on the active layer 23. The gate electrode 25 is formed on a portion of the gate insulating layer 24. The gate insulating layer 24 insulates the active layer 23 from the gate electrode 25, and may be formed of an organic material or an inorganic material such as, for example, SiNx or $SiO_2$.

In the present embodiment, the insulating patterns IP and the separate areas SA are at the bending area BA. The insulating patterns IP include the same material as that of the gate insulating layer 24, and may be concurrently (e.g., simultaneously) formed with the gate insulating layer 24. That is, the gate insulating layer 24, the insulating patterns IP, and the separate areas SA may be formed by using a pattern processing using one mask. However, the present embodiment is not limited thereto, and the insulating patterns IP include the same material as that of the buffer layer 22, and may be concurrently/simultaneously formed with the buffer layer 22.

The gate electrode 25 may include, for example, gold (Au), silver (Ag), copper (Cu), nickel (Ni), platinum (Pt), palladium (Pd), aluminum (Al), or molybdenum (Mo), and may include an alloy such as an Al:Nd, Mo:W alloy, but is not limited thereto. That is, the gate electrode 25 may be formed of various materials according to, or in consideration of, adhesion with adjacent layers, a surface flatness of a staked layer, electrical resistance, plasticity or the like.

In the present embodiment, the wirings MW are formed on the bending area BA, may be formed of the same material as that of the gate electrode 25, and may be concurrently/simultaneously formed with the gate electrode 25. That is, the gate electrode 25 and the wirings MW may be formed by using a patterning method using one mask. In addition, the wirings MW may be electrically coupled to the gate electrode 25.

An interlayer insulating layer 26 is formed on the gate electrode 25. The interlayer insulating layer 26 and the gate insulating layer 24 are formed so as to expose the source region and the drain region of the active layer 23. In addition, the source electrode 27 and the drain electrode 28 are formed to contact exposed portions of the source region and the drain region of the active layer 23, respectively. The source electrode 27 and the drain electrode 28 may be formed of various conductive materials, and may have a single-layer structure or a multilayer structure.

In the present embodiment, the interlayer insulating layer 26 may extend (e.g., extend a relatively long way) to cover the wirings MW, like the protective layer PV shown in FIG. 4B.

Alternatively, the wirings MW may be formed of the same material as that of the source electrode 27 and the drain electrode 28, and may be concurrently/simultaneously formed with the source electrode 27 and the drain electrode 28. In the present embodiment, the insulating patterns IP may be formed of the same material as that of the interlayer insulating layer 26, and may be concurrently/simultaneously formed with the interlayer insulating layer 26.

A passivation layer 29 is formed on the thin film transistor TFT. In detail, the passivation layer 29 is formed on the source electrode 27 and the drain electrode 28. The passivation layer 29 is formed to not cover an entire region of the drain electrode 28, to thereby expose a portion of the drain electrode 28. The first electrode 30 is formed to be coupled to the exposed portion of the drain electrode 28. The first electrode 30 may include, for example, ITO, IZO, ZnO, or $In_2O_3$, or alternatively, may include, for example, silver (Ag), magnesium (Mg), aluminum (Al), platinum (Pt), palladium (Pd), gold (Au), nickel (Ni), neodymium (Nd), iridium (Ir), chromium (Cr), or a combination thereof.

A pixel definition layer 31 is formed of an insulating material on the first electrode 30, and is formed so as to expose a region of the first electrode 30. The intermediate layer 32 including an organic light-emitting layer is formed to contact the exposed region of the first electrode 30. In addition, the second electrode 33 is formed to be coupled to the intermediate layer 32.

The intermediate layer 32 including the organic light-emitting layer may include a low molecular weight or high molecular weight organic material. If the organic light-emitting layer is formed of a low molecular weight organic material, the organic light-emitting layer may further include at least one layer from among a hole injection layer (HIL), a hole transport layer (HTL), an electron transport layer (ETL), and an electron injection layer (EIL).

The second electrode 33 may include, for example, lithium (Li), calcium (Ca), LiF/Ca, LiF/Al, Al, Ag, Mg, or a combination thereof, or may include, for example, ITO, IZO, ZnO, or $In_2O_3$.

An encapsulation member may be located on the second electrode 33, and may protect the organic light-emitting device 35 and other layers from external moisture or oxygen, and may be formed of plastic. In addition, the encapsulation member may be formed to have a multilayer structure including an organic material and an inorganic material.

According to the present embodiment, the flexible display apparatus 300 includes the insulating patterns IP and the separate areas SA, which are located between the substrate 301 and the wirings MW of the bending area BA. The insulating patterns IP and the separate areas SA may be in parallel to the reference line L1, or may be inclined with respect to the reference line L1. Thus, even if the flexible display apparatus 300 is folded or bent with respect to the reference line L1, the separate areas SA located between the insulating patterns IP of the bending area BA relieve stress, thereby reducing stress applied to the insulating patterns IP. Thus, damage of the insulating patterns IP is avoided, thereby avoiding damage of the wirings MW. To increase an effect for avoiding damage of the insulating patterns IP, the insulating patterns IP and the separate areas SA may be formed in parallel to the reference line L1.

In addition, the separate areas SA are formed to the two side ends of the substrate 301, thereby increasing an effect for relieving stress via the separate areas SA.

Due to the insulating patterns IP and the separate areas SA, the wirings MW may be formed to have an uneven shape. Thus, when the flexible display apparatus 300 is folded or bent with respect to the reference line L1, an effect for relieving stress of the wirings MW of the bending area BA is increased. That is, because of an increase in a surface area of the wirings MW on the bending area BA, and because of protruding portions and concave portions that are alternately formed on the wirings MW, stress applied to the wirings MW may be effectively relieved. Thus, the durability of the flexible display apparatus 300 is increased.

According to the one or more embodiments of the present invention, a flexible display apparatus may increase durability and user convenience.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A flexible display apparatus comprising:
   a flexible substrate having:
      a bending area; and
      a non-bending area adjacent the bending area, and having a display area for realizing a visible image;
   a plurality of wirings at the bending area; and
   a plurality of insulating patterns between the flexible substrate and the plurality of wirings,
   wherein respective ones of the plurality of insulating patterns are separated by separate areas.

2. The flexible display apparatus of claim 1, wherein the bending area is configured to be bent or folded with respect to a reference line.

3. The flexible display apparatus of claim 2, wherein the reference line is at the bending area.

4. The flexible display apparatus of claim 2, wherein the separate areas are parallel to the reference line.

5. The flexible display apparatus of claim 2, wherein the separate areas are not perpendicular to the reference line.

6. The flexible display apparatus of claim 2, wherein the plurality of insulating patterns is parallel to the reference line.

7. The flexible display apparatus of claim 2, wherein the plurality of insulating patterns is not perpendicular to the reference line.

8. The flexible display apparatus of claim 1, wherein the separate areas extend in stripes.

9. The flexible display apparatus of claim 1, wherein the separate areas extend to two ends of the flexible substrate that face each other.

10. The flexible display apparatus of claim 1, wherein the plurality of insulating patterns extends in stripes.

11. The flexible display apparatus of claim 1, wherein the plurality of wirings is conformally arranged on the substrate and the plurality of insulating patterns.

12. The flexible display apparatus of claim 1, further comprising a protective layer on the plurality of wirings.

13. The flexible display apparatus of claim 12, wherein the protective layer is conformally arranged on the plurality of wirings.

14. The flexible display apparatus of claim 1, wherein the plurality of wirings has one or more via holes.

15. The flexible display apparatus of claim 14, wherein the one or more via holes of the plurality of wirings are a plurality of dot-type via holes or stripe-type via holes.

16. The flexible display apparatus of claim 1, wherein the non-bending area has a first non-bending area and a second non-bending area, and
   wherein the bending area is between the first non-bending area and the second non-bending area.

17. The flexible display apparatus of claim 16, wherein the first non-bending area and the second non-bending area respectively comprise display areas.

18. The flexible display apparatus of claim 16, wherein one of the first non-bending area and the second non-bending area comprises the display area for displaying an image, and
   wherein the other one of the first non-bending area and the second non-bending area comprises a region corresponding to a circuit pattern for driving the display area.

19. The flexible display apparatus of claim 1, wherein the display area of the non-bending area comprises an organic light-emitting device, and
   wherein the organic light-emitting device comprises:
      a first electrode;
      a second electrode; and
      an intermediate layer between the first electrode and the second electrode, and comprising an organic-light emitting layer.

20. The flexible display apparatus of claim 19, further comprising a thin film transistor that is electrically coupled to the organic light-emitting device and that comprises an active layer, a gate electrode, a source electrode, and a drain electrode.

21. The flexible display apparatus of claim 20, wherein the plurality of wirings comprises a same material as any one of the gate electrode, the source electrode, and the drain electrode, and are concurrently formed with any one of the gate electrode, the source electrode, and the drain electrode.

22. The flexible display apparatus of claim 20, further comprising:
   a gate insulating layer between the active layer and the gate electrode; and
   an interlayer insulating layer between the gate electrode and the source electrode, and between the gate electrode and the drain electrode,
   wherein the plurality of insulating patterns comprises a same material as any one of the gate insulating layer and the interlayer insulating layer, and are concurrently formed with any one of the gate insulating layer and the interlayer insulating layer.

23. The flexible display apparatus of claim 20, further comprising a buffer layer between the substrate and the thin film transistor,
   wherein the plurality of insulating patterns comprises a same material as the buffer layer, and are concurrently formed with the buffer layer.

* * * * *